(12) United States Patent
Nagase (10) Patent No.: US 9,722,594 B2
(45) Date of Patent: Aug. 1, 2017

(54) DRIVE DEVICE

(71) Applicant: DENSO CORPORATION, Kariya, Aichi-pref. (JP)

(72) Inventor: Takuo Nagase, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 15/117,528

(22) PCT Filed: Mar. 12, 2015

(86) PCT No.: PCT/JP2015/001365
§ 371 (c)(1),
(2) Date: Aug. 9, 2016

(87) PCT Pub. No.: WO2015/146040
PCT Pub. Date: Oct. 1, 2015

(65) Prior Publication Data
US 2016/0352320 A1    Dec. 1, 2016

(30) Foreign Application Priority Data
Mar. 27, 2014    (JP) ................................ 2014-066596

(51) Int. Cl.
*H02M 1/08*    (2006.01)
*H02M 1/32*    (2007.01)
(Continued)

(52) U.S. Cl.
CPC .......... *H03K 17/0828* (2013.01); *H02M 1/08* (2013.01); *H02M 1/088* (2013.01);
(Continued)

(58) Field of Classification Search
CPC .......... H02M 1/00; H02M 1/08; H02M 1/088; H02M 1/32; H02M 2001/00;
(Continued)

(56) References Cited

U.S. PATENT DOCUMENTS 5,500,619 A    3/1996    Miyasaka
6,222,403 B1    4/2001    Mitsuda
(Continued)

FOREIGN PATENT DOCUMENTS

JP    2000-295838 A    10/2000
JP    2001-223571 A    8/2001
(Continued)

*Primary Examiner* — Lincoln Donovan
*Assistant Examiner* — David Mattison
(74) *Attorney, Agent, or Firm* — Posz Law Group, PLC (57) ABSTRACT

A drive device includes an off-side circuit controlling a gate current of a power switching element to perform an off operation. The off-side circuit includes: a main MOS transistor; a sense MOS transistor defining a drain current of the main MOS transistor; and a sense current control circuit controlling a drain current of the sense MOS transistor to be constant. The sense current control circuit includes: a reference power supply; a reference resistor; and an operational amplifier generating an output at the gate of the sense MOS transistor so that a potential between the reference resistor and the sense MOS transistor approaches the reference potential. The sense current control circuit flows a current, determined by a resistance value of the reference resistor and the reference potential, as the drain current of the sense MOS transistor.

8 Claims, 4 Drawing Sheets

(51) Int. Cl.
*H03K 17/30* (2006.01)
*H02M 1/088* (2006.01)
*H03K 17/567* (2006.01)
*H03K 17/687* (2006.01)
*H03K 17/082* (2006.01)
*H03K 17/16* (2006.01)
*H02M 1/00* (2006.01)

(52) U.S. Cl.
CPC ............ *H02M 1/32* (2013.01); *H03K 17/168* (2013.01); *H03K 17/30* (2013.01); *H03K 17/567* (2013.01); *H03K 17/687* (2013.01); *H03K 17/6877* (2013.01); *H02M 2001/0009* (2013.01); *H02M 2001/0054* (2013.01); *H03K 2217/0036* (2013.01); *Y02B 70/1491* (2013.01)

(58) Field of Classification Search
CPC .. H02M 2001/0009; H02M 2001/0054; H03K 17/00; H03K 17/04126; H03K 17/063; H03K 17/0826; H03K 17/0828; H03K 17/168; H03K 17/30; H03K 17/567; H03K 17/601; H03K 17/687; H03K 17/6877; H03K 2217/00; H03K 2217/0036; Y02B 70/00; Y02B 70/1491
USPC ........................................................ 327/109
See application file for complete search history.

(56) References Cited

U.S. PATENT DOCUMENTS

| | | | |
|---|---|---|---|
| 6,271,709 | B1 | 8/2001 | Kimura et al. |
| 2003/0001630 | A1 | 1/2003 | Sakata et al. |
| 2003/0206039 | A1 | 11/2003 | Sakata et al. |
| 2003/0206040 | A1 | 11/2003 | Sakata et al. |
| 2006/0181831 | A1 | 8/2006 | Kojima |
| 2010/0213989 | A1 | 8/2010 | Nakatake et al. |
| 2011/0316507 | A1 | 12/2011 | Wang et al. |

FOREIGN PATENT DOCUMENTS

| | | |
|---|---|---|
| JP | 2010-034701 A | 2/2010 |
| JP | 2012-227825 A | 11/2012 |
| JP | 2014-054019 A | 3/2014 |

DRIVE DEVICE

CROSS REFERENCE TO RELATED APPLICATIONS

This application is a U.S. national stage of International Application No. PCT/JP2015/001365 filed on Mar. 12, 2015 and is based on Japanese Patent Application No. 2014-66596 filed on Mar. 27, 2014, the disclosures of which are incorporated herein by reference.

TECHNICAL FIELD

The present disclosure relates to a drive device that performs on/off control and protection in an abnormal condition for a power switching element.

BACKGROUND ART

Active gate control (AGC) which actively controls a gate voltage or a gate current is used as a technique for improving a trade-off between a surge voltage and a switching loss during a switching operation in a power switching element that constitutes a semiconductor power conversion device such as an inverter or a converter.

For example, Patent Literature 1 proposes a drive circuit that reduces a gate voltage to reduce a collector current when an excessive current flows through a power switching element to protect the power switching element so as not to be destroyed.

However, in Patent Literature 1, a large number of MOS-FETs and resistors are required for controlling the gate current of the power switching element. Thus, a circuit scale, that is, the layout area becomes large.

Further, the technique of Patent Literature 1 controls the gate current on the basis of a resistance value of the resistor connected to the gate of the power switching element. Thus, variations in the threshold voltage caused by manufacture variations produce variations in the switching speed and variations in the switching loss. That is, the switching loss falls out of the standard defined in specifications, and yields are disadvantageously reduced.

PRIOR ART LITERATURES

Patent Literature

Patent Literature 1: JP-2010-34701-A

SUMMARY OF INVENTION

It is an object of the present disclosure to reduce the switching loss by controlling the output current with high accuracy while reducing the circuit scale in a drive device that performs a turning-off operation for the power switching element.

According to an aspect of the present disclosure, a drive device for controlling a power switching element to turn on and off includes an off-side circuit that controls a gate current of the power switching element to perform an off operation. The off-side circuit includes: a main MOS transistor as an output transistor; a sense MOS transistor that includes a gate in common with the main MOS transistor, and provides a current mirror with respect to the main MOS transistor to define a drain current of the main MOS transistor; and a sense current control circuit that controls a drain current of the sense MOS transistor to be constant. The sense current control circuit includes: a reference power supply that generates a reference potential; a reference resistor connected in series to the sense MOS transistor; and an operational amplifier that generates an output at the gate of the sense MOS transistor so that a potential between the reference resistor and the sense MOS transistor approaches the reference potential. The sense current control circuit flows a current, determined by a resistance value of the reference resistor and the reference potential, as the drain current of the sense MOS transistor.

According to this configuration, the drain current of the sense MOS transistor that defines the drain current of the main MOS transistor by the current mirror is defined by the reference potential and the resistance value of the reference resistor. Thus, the output current can be controlled with high accuracy regardless of the power supply voltage that supplies power to the drive device according to the present disclosure and the current value of the output current of the off-side circuit. Thus, it is possible to reduce variations in the gate current of the power switching element and reduce the switching loss.

Further, the number of passive elements such as a resistor can be reduced compared to conventional techniques such as Patent Literature 1. Thus, it is possible to reduce the layout area. For example, the drive device according to the present disclosure and the power switching element can be mounted on the same package to achieve integration.

In Patent Literature 1, the gate current for driving the gate of the power switching element is large, and the resistor which is a discrete part is required due to the necessity of accuracy. On the other hand, in the circuit configuration of the present disclosure, no resistor is required in a series path of the gate of the power switching element. Thus, it is possible to reduce discrete parts and achieve easy integration.

BRIEF DESCRIPTION OF DRAWINGS

The above and other objects, features and advantages of the present disclosure will become more apparent from the following detailed description made with reference to the accompanying drawings. In the drawings.

EMBODIMENTS FOR CARRYING OUT INVENTION

First Embodiment

First, a drive device according to a first embodiment will be described with reference to FIG. 1.

Figure 1:
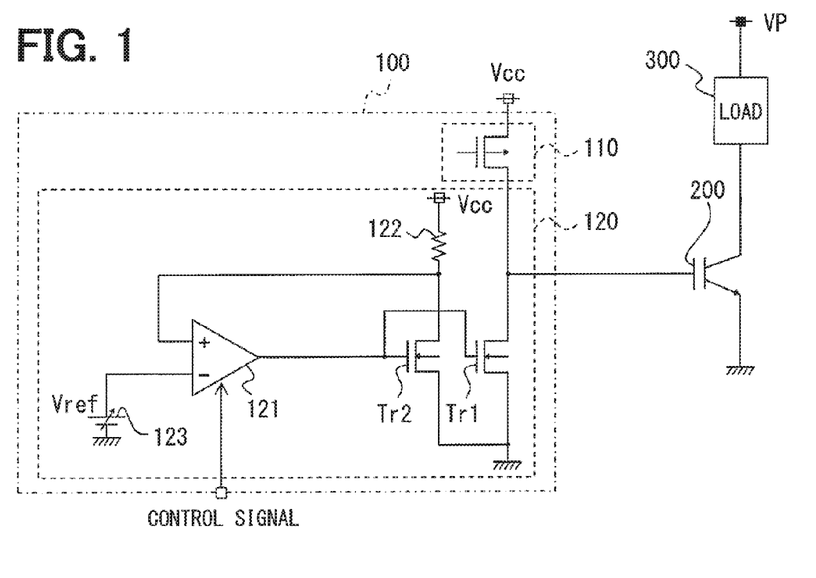
FIG. 1 is a circuit diagram illustrating a schematic configuration of a drive device according to a first embodiment.

As illustrated in FIG. 1, the drive device 100 controls the drive of an insulated gate bipolar transistor (IGBT) 200 as a power switching element which drives a load 300.

The drive device 100 includes an on-side circuit 110 and an off-side circuit 120.

The on-side circuit 110 and the off-side circuit 120 are connected in series between a power supply and the GND. A gate of the IGBT 200 is connected to an intermediate point between the on-side circuit 110 and the off-side circuit 120. The on-side circuit 110 includes a PMOS transistor. When the PMOS transistor is in an on state, a power supply voltage Vcc is applied to the gate of the IGBT 200. Accordingly, the IGBT 200 is turned on, and a current flows between a collector and an emitter of the IGBT 200, so that power is supplied to the load 300.

The off-side circuit 120 includes two NMOS transistors (Tr1, Tr2). These NMOS transistors include a main MOS transistor Tr1 as an output transistor and a sense MOS transistor Tr2 which defines a drain current of the main MOS transistor Tr1. In the present embodiment, the main MOS transistor Tr1 constitutes a current mirror with respect to the sense MOS transistor Tr2. Specifically, a gate of the main MOS transistor Tr1 is common with a gate of the sense MOS transistor Tr2, and sources thereof are connected in common to the GND. A drain of the main MOS transistor Tr1 is connected to the gate of the IGBT 200.

In such a configuration, a drain current flows through the main MOS transistor Tr1 with a current ratio that is equal to a size ratio of the sense MOS transistor Tr2.

The off-side circuit 120 includes an operational amplifier 121 for controlling a drain current of the sense MOS transistor Tr2, a reference resistor 122 for defining an output of the operational amplifier 121, and a reference power supply 123 which applies a reference potential Vref to one input terminal of the operational amplifier 121. When a control signal indicating turning-off of the IGBT 200 is input to the operational amplifier 121 from a microcomputer (not illustrated), the operational amplifier 121 applies a voltage to the gate of the sense MOS transistor Tr2 so as to draw a constant current from the gate of the IGBT 200.

The reference resistor 122 is a shunt resistor and defines a current value of the drain current of the sense MOS transistor Tr2. Further, the reference resistor 122 defines a current value of the current drawn from the gate of the IGBT 200. The current drawn from the gate of the IGBT 200 is the drain current flowing through the main MOS transistor Tr1. The main MOS transistor Tr1 constitutes the current mirror together with the sense MOS transistor Tr2. Thus, the current drawn from the gate of the IGBT 200 depends on the drain current of the sense MOS transistor Tr2.

In such a configuration, when a control signal indicating turning-off of the IGBT 200 is input, the operational amplifier 121 is driven to apply a gate voltage to the sense MOS transistor Tr2. A drain current at this time is defined by a resistance value R of the reference resistor 122. The current value is feedback-controlled by adjusting the output of the operational amplifier 121 so that a potential at a connection point between the reference resistor 122 and the sense MOS transistor Tr2 approaches the reference potential Vref. Accordingly, the drain current of the sense MOS transistor Tr2 is controlled at a constant value (=(Vcc−Vref)/R) with high accuracy. Thus, the current drawn from the gate of the IGBT 200 is also maintained at a constant current with high accuracy. In the present embodiment, a sense current control circuit corresponds to a circuit that includes the operational amplifier 121, the reference resistor 122, and the reference power supply 123.

Next, effects of the drive device 100 according to the present embodiment will be described.

The drain current of the sense MOS transistor Tr2 which defines the drain current of the main MOS transistor Tr1 by the current mirror is defined by the reference potential Vref and the resistance value R of the reference resistor. Thus, the output current can be controlled with high accuracy regardless of the power supply voltage Vcc which supplies power to the drive device 100 and the current value of the output current of the off-side circuit. Thus, it is possible to reduce variations in the gate current of the IGBT 200 and reduce the switching loss.

Figure 2:
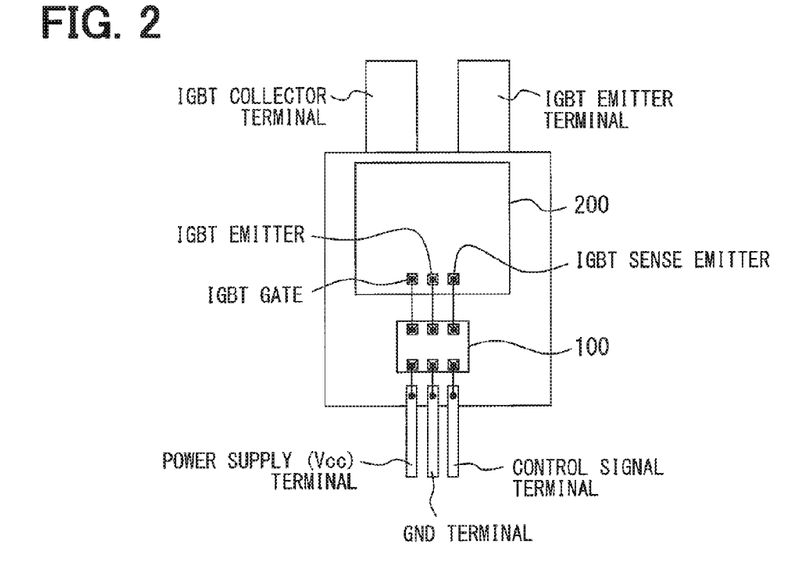
FIG. 2 is a top view illustrating schematic configurations of the drive device and a power switching element.

Further, the number of components of passive elements such as a resistor can be reduced compared to conventional techniques. Thus, it is possible to reduce the layout area of the drive device 100. For example, as illustrated in FIG. 2, the drive device 100 and the IGBT 200 can be mounted on the same package to achieve integration.

For example, in Patent Literature 1, the gate current for driving the gate of the power switching element is large, and the resistor which is a discrete part is required due to the necessity of accuracy. On the other hand, in the circuit configuration of the present disclosure, no resistor is required in a series path of the gate of the power switching element. Thus, it is possible to reduce discrete parts and achieve easy integration.

Second Embodiment

Figure 3:
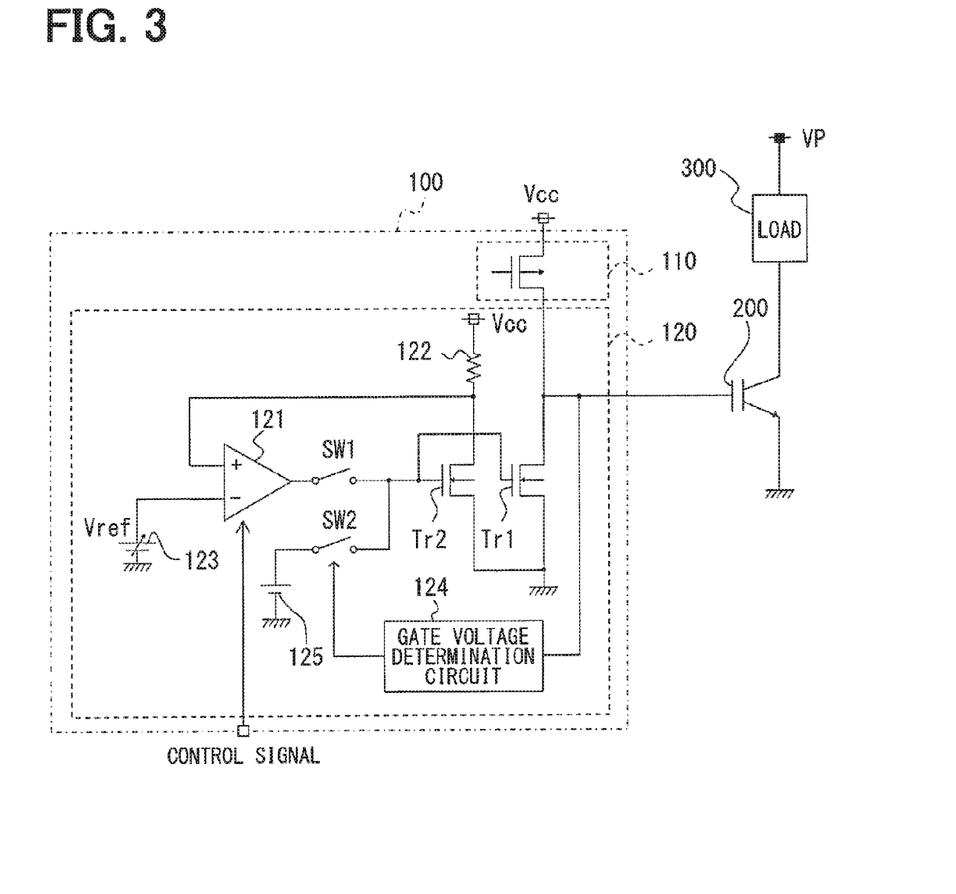
FIG. 3 is a circuit diagram illustrating a schematic configuration of a drive device according to a second embodiment.

As illustrated in FIG. 3, a drive device 100 according to a second embodiment includes, as constituent elements of the off-side circuit 120, a gate voltage determination circuit 124, a drive capacity changeover power supply 125, and drive capacity changeover switches SW1, SW2 in addition to the elements in the first embodiment.

First, the constituent elements of the drive device 100 according to the present embodiment will be described with reference to FIG. 3.

The gate voltage determination circuit 124 compares a gate voltage of the IGBT 200 with a predetermined threshold (hereinbelow, referred to as a gate voltage determination threshold V1) and switches on/off of the drive capacity changeover switches SW1, SW2 (described below) on the basis of a large-small relationship between the gate voltage and the gate voltage determination threshold V1.

The drive capacity changeover power supply 125 is connected to the gate of the sense MOS transistor Tr2 in parallel to the operational amplifier 121. A voltage applied to the gate of the sense MOS transistor Tr2 by the drive capacity changeover power supply 125 in the present embodiment is set to be higher than a voltage applied by the operational amplifier 121.

The drive capacity changeover switches SW1, SW2 switch an application source of the voltage applied to the gate of the sense MOS transistor Tr2 between the operational amplifier 121 and the drive capacity changeover power supply 125. Specifically, the switch SW1 is connected between the gate of the sense MOS transistor Tr2 and the output terminal of the operational amplifier 121. The switch SW2 is connected between the gate of the sense MOS transistor Tr2 and the drive capacity changeover power supply 125.

Figure 4:
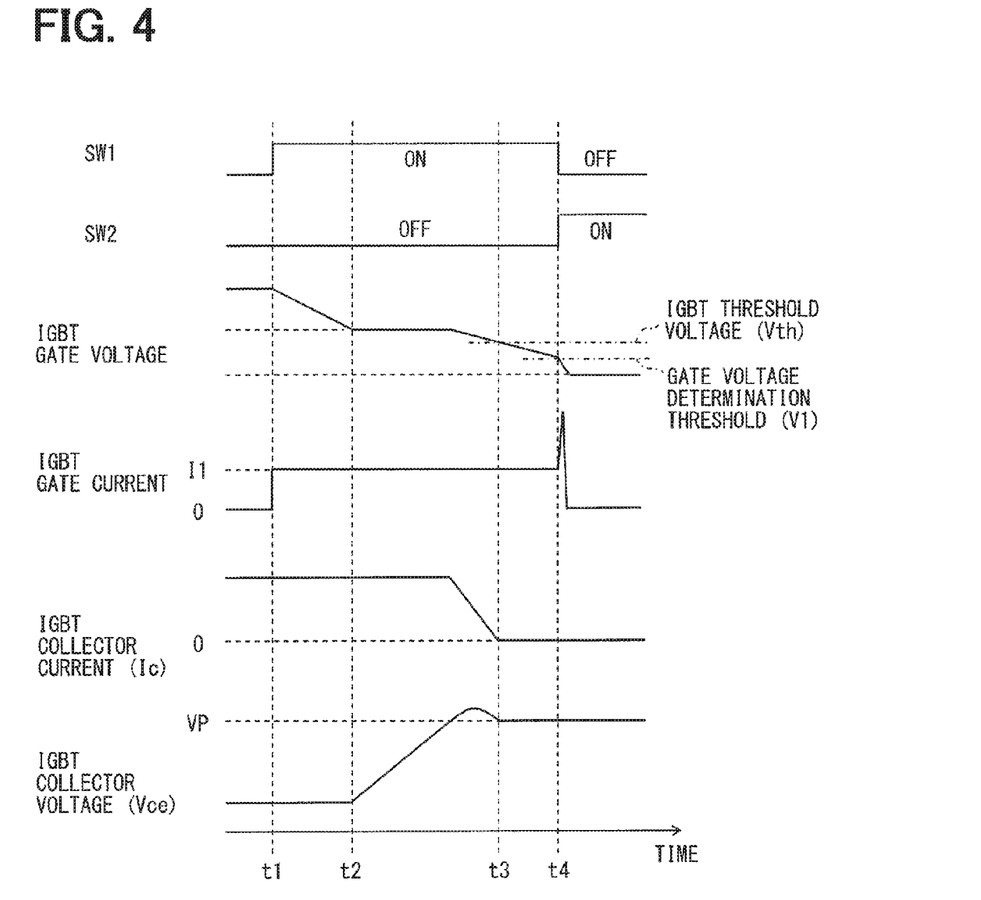
FIG. 4 is a timing chart illustrating driving by the drive device.

Next, the operation and effects of the drive device 100 according to the present embodiment will be described with reference to FIG. 4.

At a time t1, a control signal indicating turning-off of the IGBT 200 is input to the operational amplifier 121. At the time t1, the sense MOS transistor Tr2 is driven by the operational amplifier 121 to control the output current with high accuracy. That is, the drive capacity changeover switch SW1 is turned on, and the drive capacity changeover switch SW2 is in an off state. Accordingly, as illustrated in FIG. 4, the operational amplifier 121 is driven, so that the gate current of the IGBT 200 flows.

When the drawing of a charge is started from the gate of the IGBT 200, the gate voltage decreases. Then, at a time t2, when a predetermined time passes after the reduction in the gate voltage to a predetermined potential (mirror potential), the collector voltage Vce starts increasing. Then, the collector current Ic starts decreasing at the point when the collector voltage reaches the power supply voltage VP.

Then, at a time t3, when the gate voltage of the IGBT 200 falls below a threshold voltage (Vth), the collector current Ic converges to zero, and the collector voltage Vce converges to the power supply voltage VP.

The drive capacity changeover switch SW1 is maintained in an on state also thereafter. Thus, the drawing of the gate charge of the IGBT 200 by the off-side circuit 120 is continued. Accordingly, the gate voltage of the IGBT 200 continuously decreases. Then, at a time t4, when the gate voltage falls below the gate voltage determination threshold V1 set in the gate voltage determination circuit 124, the gate voltage determination circuit 124 causes the drive capacity changeover switch SW1 to transition from on to off and the drive capacity changeover switch SW2 to transition from off to on. That is, not the output from the operational amplifier 121, but the voltage of the drive capacity changeover power supply 125 is applied to the gate of the main MOS transistor Tr1.

The voltage applied to the gate of the main MOS transistor Tr1 by the drive capacity changeover power supply 125 is set to be higher than the voltage applied by the operational amplifier 121. Thus, the drain current of the main MOS transistor Tr1 becomes large. Thus, at the time t4, the gate current of the IGBT 200 rapidly increases. That is, the drive capacity of the off-side circuit 120 increases. Accordingly, the gate charge of the IGBT 200 is rapidly drawn, and the gate voltage becomes zero. That is, the off operation of the IGBT 200 is completed. When the IGBT 200 is turned on next time, the on-side circuit 110 is driven after an on-to-off transition of the drive capacity changeover switch SW2.

The drive capacity changeover switch SW2 is maintained in an on state also after the time t4. Thus, a short circuit with a low impedance between the gate and the emitter of the IGBT 200 can be maintained. Thus, it is possible to prevent the IGBT 200 in an off state from being erroneously turned on by, for example, noise. That is, a reliable off-holding can be performed.

The off-holding can also be performed by increasing the drain current of the sense MOS transistor Tr2 by reducing the reference potential Vref of the reference power supply 123 connected to the operational amplifier 121 to improve the drive capacity of the off-side circuit 120. However, the accuracy of the output current of the off-side circuit 120 is not required for the off-holding, and the switching response speed can be made higher by the switching of the drive capacity by the switch between the drive capacity changeover switches SW1, SW2 than the above method.

The voltage of the drive capacity changeover power supply 125 used for the off-holding is sufficiently larger than the output of the operational amplifier 121 because a sufficient voltage to turn off the IGBT 200 is set. Accurate control is not required for this voltage. Thus, a complicated circuit is not required. Thus, the drive device 100 in the present embodiment can be achieved without increasing a circuit scale compared to the first embodiment.

Third Embodiment

Figure 5:
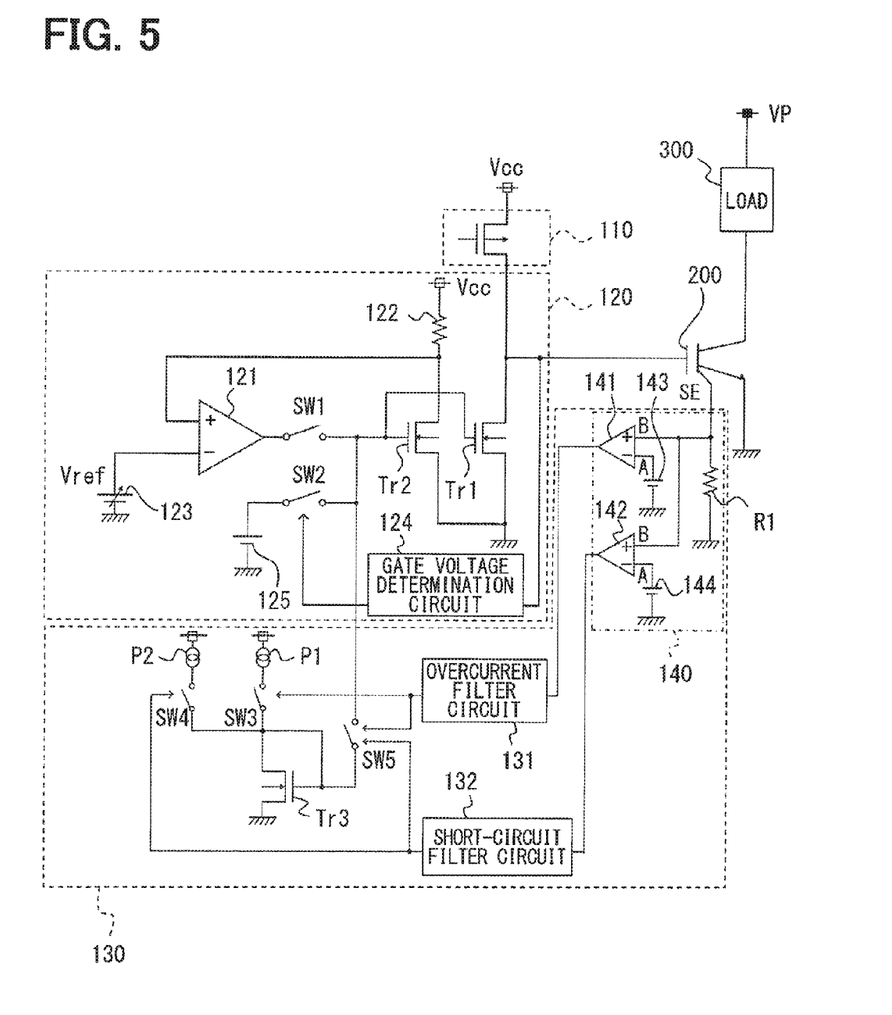
FIG. 5 is a circuit diagram illustrating a schematic configuration of a drive device according to a third embodiment.

As illustrated in FIG. 5, a drive device 100 according to a third embodiment includes a protection circuit 130 in addition to the elements in the second embodiment.

First, constituent elements of the drive device 100 according to the present embodiment will be described with reference to FIG. 5.

The protection circuit 130 includes a protection MOS transistor Tr3, constant-current circuits P1, P2 which supply drain currents to the protection MOS transistor Tr3, protection switches SW3, SW4 which control the current supply from the constant-current circuits P1, P2 to the protection MOS transistor Tr3, and a collector current detector 140 which detects a collector current of the IGBT 200 from a current of a sense emitter terminal SE.

A gate of the protection MOS transistor Tr3 is connected to a gate of the main MOS transistor Tr1 of the off-side circuit 120 through a switch SW5 and constitutes a current mirror with respect to the main MOS transistor Tr1. Thus, controlling the drain current of the protection MOS transistor Tr3 enables the drain current of the main MOS transistor Tr1 to be controlled without driving of the sense MOS transistor Tr2. In other words, it is possible to control the gate current of the IGBT 200 without using the sense current control circuit (the circuit including the operational amplifier 121, the reference resistor 122, and the reference power supply 123) formed in the off-side circuit 120.

The constant-current circuit P1 is connected to a drain of the protection MOS transistor through the protection switch SW3. The constant-current circuit P2 is connected to the drain of the protection MOS transistor Tr3 in parallel to the constant-current circuit P1 through the protection switch SW4. The current supplied by the constant-current circuit P1 and the current supplied by the constant-current circuit P2 are set to different current values, so that different drain currents can be supplied to the protection MOS transistor Tr3 by switch between the protection switches SW3, SW4. The currents supplied by the constant-current circuits P1 and P2 are set to values smaller than the drain current that normally flows through the sense MOS transistor Tr2. In the present embodiment, the current value of the constant-current circuit P2 is set to be smaller than the current value of the constant-current circuit P1.

The collector current detector 140 detects the collector current of the IGBT 200 and protects the IGBT 200 from an overcurrent or a short circuit of the load 300. The current detector 140 includes comparators 141, 142, voltage sources 143, 144 which apply a voltage to be a threshold to input terminals A of the comparators 141, 142, and a resistor R1 for converting the collector current of the IGBT 200 into a voltage.

More specifically, as illustrated in FIG. 5, the voltage source 143 is connected to one input terminal A of the comparator 141. The other input terminal B of the comparator 141 is connected to an intermediate point between the sense emitter terminal SE of the IGBT 200 and the resistor R1 which is connected between the sense emitter terminal SE and the GND. That is, a voltage corresponding to a current flowing from the sense emitter terminal SE of the IGBT 200 toward the GND and a resistance value of the resistor R1 is applied to the input terminal B of the comparator 141. The voltage applied to the input terminal B is proportional to the current flowing from the sense emitter terminal SE toward the GND. That is, this voltage increases as the collector current of the IGBT 200 increases.

The comparator 141 outputs a signal so as to turn on the protection switch SW3 and the switch SW5 through an overcurrent filter circuit 131 when the voltage corresponding to the current flowing through the sense emitter terminal SE exceeds the voltage of the voltage source 143, that is, when the collector current exceeds a predetermined threshold (an overcurrent detection threshold).

The comparator 142 has the same configuration as the comparator 141. Specifically, a voltage source 144 is connected to one input terminal A of the comparator 142. The other input terminal B of the comparator 142 is connected to an intermediate point between the sense emitter terminal SE of the IGBT 200 and the resistor R1 which is connected between the sense emitter terminal SE and the GND.

The comparator 142 outputs a signal so as to turn on the protection switch SW4 and the switch SW5 through a short-circuit filter circuit 132 when the voltage corresponding to the current flowing through the sense emitter terminal SE exceeds the voltage of the voltage source 144, that is, when the collector current exceeds a predetermined threshold (a short-circuit detection threshold).

A voltage that produces a determination of an overcurrent for the IGBT 200 is set at the voltage source 143. A voltage that produces a determination of a short circuit in the load 300 is set at the voltage source 144. That is, the voltage of the voltage source 144 is set to be higher than the voltage of the voltage source 143.

When input information is maintained in a certain state within a preset filter time, the filter circuits (131, 132) output a signal corresponding to the input. For example, when the collector current detector 140 has detected a collector current that exceeds the overcurrent detection threshold for a predetermined filter time set in the overcurrent filter circuit 131 or more, the protection switch SW3 and the switch SW5 are turned on. Further, for example, when the collector current detector 140 has detected a collector current that exceeds the short-circuit detection threshold for a predetermined filter time set in the short-circuit filter circuit 132 or more, the protection switch SW4 and the switch SW5 are turned on.

The filter circuits (131, 132) are provided for preventing the protection circuit 130 from operating by, for example, a pulse noise in the collector current of the IGBT 200.

Next, the operation and effects of the drive device 100 according to the present embodiment will be described.

For example, when a collector current excessively larger than a normal current (overcurrent) flows through the IGBT 200, the potential at the input terminal B of the comparator 141 of the collector current detector 140 becomes higher than the potential at the input terminal A due to the overcurrent, and the comparator 141 outputs this state to the overcurrent filter circuit 131. When the overcurrent state is continued for the filter time previously set in the overcurrent filter circuit 131, the overcurrent filter circuit 131 turns off the drive capacity changeover switches SW1, SW2, and turns on the protection switch SW3 and the switch SW5.

Accordingly, the drain current defined by the constant-current circuit P1 flows through the protection MOS transistor Tr3. Further, the mirrored drain current also flows through the main MOS transistor Tr1 which constitutes the current mirror together with the protection MOS transistor Tr3. The current value of the constant-current circuit P1 is set to be smaller than a drain current that normally flows through the sense MOS transistor Tr2. Thus, it is possible to reduce the drive capacity compared to the case in which the output current of the off-side circuit 120 is controlled by the drain current of the sense MOS transistor Tr2.

When the collector current of the IGBT 200 is in an overcurrent state, a large surge occurs in the collector voltage Vce during turning-off, which increases the possibility of destruction of the IGBT 200. Thus, it is possible to safely interrupt and protect the IGBT 200 by reducing the drive capacity of the off-side circuit 120 to reduce the surge voltage.

On the other hand, when the load 300 is short-circuited and a collector current larger than an overcurrent flows through the IGBT 200, the potential at the input terminal B of the comparator 142 of the collector current detector 140 becomes higher than the potential at the input terminal A due to the short circuit, and the comparator 142 outputs this state to the short-circuit filter circuit 132. When the short-circuit state is continued for the filter time previously set in the short-circuit filter circuit 132, the short-circuit filter circuit 132 turns off the drive capacity changeover switches SW1, SW2, and turns on the protection switch SW4 and the switch SW5.

Accordingly, the drain current defined by the constant-current circuit P2 flows through the protection MOS transistor Tr3. The current value of the constant-current circuit P2 is set to be smaller than the current value of the constant-current circuit P1. Thus, it is possible to further reduce the drive capacity than the case of the overcurrent and to reduce the surge voltage.

The filter time previously set in the short-circuit filter circuit 132 is preferably set to be shorter than the filter time set in the overcurrent filter circuit because of the following reason. Specifically, a current value of the collector current during a short circuit is larger than that during an overcurrent. Thus, the stress of the IGBT 200 can be reduced by turning off the IGBT 200 within a short time. Further, a minimum filter time is required to prevent protection against an overcurrent or short circuit from being erroneously performed due to a nose in switching during a normal operation.

Other Embodiments

Although the preferred embodiments of the present disclose have been described above, the present disclosure is not limited at all to the above embodiments. The present disclosure can be performed with various modifications without departing from the gist of the present disclosure.

Although, in each of the above embodiments, the IGBT 200 has been described as an example of the power switching element, the present disclosure is not limited to this example. For example, the present disclosure may also be applied to a power MOS transistor as a power switching element.

The reference potential Vref is preferably set to a value corresponding to a previously-measured gate capacitance of the power switching element. Although not illustrated, a memory circuit is provided in the drive device 100, and a reference potential corresponding to the gate capacitance measured in a pre-shipment inspection (a characteristic inspection performed after manufacture) for the drive device 100 is stored in the memory. Specifically, the larger the gate capacitance is, the smaller a value of the reference potential Vref is set to increase the drive capacity of the off-side circuit 120. This enables manufacture variations in the gate capacitance of the IGBT 200 to be reduced. Thus, variations in the switching loss of the IGBT 200 can be reduced.

In the second embodiment, the voltage of the drive capacity changeover power supply 125 is set to be higher than the voltage output from the operational amplifier 121.

That is, the drive capacity changeover power supply 125 and the drive capacity changeover switch SW2 constitute an off-holding circuit. Alternatively, the voltage of the drive capacity changeover power supply 125 may be set to be lower than the voltage output from the operational amplifier 121. In this case, the drive capacity changeover power supply 125 and the drive capacity changeover switch SW2 function as a circuit that reduces the drive capacity of the off-side circuit 120.

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

The invention claimed is:

1. A drive device for controlling a power switching element to turn on and off, the drive device comprising:
an off-side circuit that controls a gate current of the power switching element to perform an off operation, wherein:
the off-side circuit includes:
a main MOS transistor as an output transistor;
a sense MOS transistor that includes a gate in common with the main MOS transistor, and provides a current mirror with respect to the main MOS transistor to define a drain current of the main MOS transistor; and
a sense current control circuit that controls a drain current of the sense MOS transistor to be constant;
the sense current control circuit includes:
a reference power supply that generates a reference potential;
a reference resistor connected in series to the sense MOS transistor; and
an operational amplifier that generates an output at the gate of the sense MOS transistor so that a potential between the reference resistor and the sense MOS transistor approaches the reference potential;
the sense current control circuit flows a current, determined by a resistance value of the reference resistor and the reference potential, as the drain current of the sense MOS transistor; and
the off-side circuit further includes:
a drive capacity changeover power supply that is connected to the gate of the sense MOS transistor in parallel to the operational amplifier, and generates a potential different from the output of the operational amplifier; and
a drive capacity changeover switch that switches a voltage applied to the gate of the main MOS transistor between the operational amplifier and the drive capacity changeover power supply.

2. The drive device according to claim 1, wherein:
the reference potential is set to a value corresponding to a preliminary measured gate capacitance of the power switching element.

3. The drive device according to claim 1, wherein:
at least one of the drive capacity changeover power supply generates a potential higher than the output of the operational amplifier; and
when a gate voltage of the power switching element falls below a predetermined threshold, the voltage applied to the gate of the main MOS transistor becomes higher than the output of the operational amplifier.

4. A drive device for controlling a power switching element to turn on and off, the drive device comprising:
an off-side circuit that controls a gate current of the power switching element to perform an off operation, wherein:
the off-side circuit includes:
a main MOS transistor as an output transistor;
a sense MOS transistor that includes a gate in common with the main MOS transistor, and provides a current mirror with respect to the main MOS transistor to define a drain current of the main MOS transistor; and
a sense current control circuit that controls a drain current of the sense MOS transistor to be constant;
the sense current control circuit includes:
a reference power supply that generates a reference potential;
a reference resistor connected in series to the sense MOS transistor; and
an operational amplifier that generates an output at the gate of the sense MOS transistor so that a potential between the reference resistor and the sense MOS transistor approaches the reference potential; and
the sense current control circuit flows a current, determined by a resistance value of the reference resistor and the reference potential, as the drain current of the sense MOS transistor;
the drive device further comprising:
a protection circuit that is connected to the gate of the main MOS transistor, and operates based on a current value of a collector current of the power switching element, wherein:
the protection circuit includes:
a protection MOS transistor that provides a current mirror together with the main MOS transistor;
a constant-current circuit that supplies a constant drain current to the protection MOS transistor;
a protection switch that is disposed between the constant-current circuit and the protection MOS transistor, and controls current supply to the protection MOS transistor; and
a collector current detector that detects the current value of the collector current of the power switching element exceeding a predetermined threshold; and
the collector current detector turns on the protection switch when the current value of the collector current of the power switching element exceeds the predetermined threshold.

5. The drive device according to claim 4, wherein:
the threshold for the collector current of the power switching element is set to be at least one of an overcurrent detection threshold and a short-circuit detection threshold higher than the overcurrent detection threshold.

6. The drive device according to claim 4, wherein:
the off-side circuit further includes:
a drive capacity changeover power supply that is connected to the gate of the sense MOS transistor in parallel to the operational amplifier, and generates a potential different from the output of the operational amplifier; and
a drive capacity changeover switch that switches a voltage applied to the gate of the main MOS transistor between the operational amplifier and the drive capacity changeover power supply.

7. The drive device according to claim 6, wherein:
at least one of the drive capacity changeover power supply generates a potential higher than the output of the operational amplifier; and
when a gate voltage of the power switching element falls below a predetermined threshold, the voltage applied to the gate of the main MOS transistor becomes higher than the output of the operational amplifier.

8. The drive device according to claim 4, wherein:
the reference potential is set to a value corresponding to a preliminary measured gate capacitance of the power switching element.

* * * * *